(12) United States Patent
Kesterson

(10) Patent No.: US 9,625,505 B2
(45) Date of Patent: Apr. 18, 2017

(54) LINE FREQUENCY DETECTOR

(71) Applicant: Dialog Semiconductor Inc., Campbell, CA (US)

(72) Inventor: John W. Kesterson, Seaside, CA (US)

(73) Assignee: Dialog Semiconductor Inc., Campbell, CA (US)

( * ) Notice: Subject to any disclaimer, the term of this patent is extended or adjusted under 35 U.S.C. 154(b) by 63 days.

(21) Appl. No.: 14/188,610

(22) Filed: Feb. 24, 2014

(65) Prior Publication Data

US 2014/0239938 A1 Aug. 28, 2014

Related U.S. Application Data

(60) Provisional application No. 61/769,122, filed on Feb. 25, 2013.

(51) Int. Cl.
*G01R 23/02* (2006.01)
*G01R 23/06* (2006.01)
*G01R 19/25* (2006.01)

(52) U.S. Cl.
CPC ......... *G01R 23/06* (2013.01); *G01R 19/2513* (2013.01)

(58) Field of Classification Search
CPC .............................. G01R 33/3621; H03H 7/12
See application file for complete search history.

(56) References Cited

U.S. PATENT DOCUMENTS

| 2003/0113122 | A1* | 6/2003 | Koga | H04L 7/027 |
| | | | | 398/155 |
| 2003/0227373 | A1* | 12/2003 | Lou | H04B 3/542 |
| | | | | 370/397 |
| 2007/0274477 | A1 | 11/2007 | Chen | |
| 2008/0008334 | A1* | 1/2008 | Saito | H04B 1/1027 |
| | | | | 381/94.7 |

(Continued)

FOREIGN PATENT DOCUMENTS

| CN | 11-326406 A | 11/1999 |
| CN | 1693906 A | 11/2005 |

(Continued)

OTHER PUBLICATIONS

European Extended Search Report, European Application No. 14156563.0, Mar. 13, 2015, 7 pages.

(Continued)

*Primary Examiner* — Jermele M Hollington
*Assistant Examiner* — Feba Pothen
(74) *Attorney, Agent, or Firm* — Fenwick & West LLP

(57) ABSTRACT

A line frequency detector receives an input signal representing a power source and detects a line frequency of the power source based on the input signal. The line frequency detector includes a first band pass filter having a pass band centered at an upper end of an expected frequency range of the power source and a second band pass filter having a pass band centered at a lower end of the expected frequency range. The input signal is filtered by the first and second band pass filters, generating a first characteristic signal and a second (Continued)

characteristic signal. The line frequency detector determines a characteristic ratio between the first characteristic signal and the second characteristic signal, and maps the characteristic ratio to the line frequency of the power source.

15 Claims, 4 Drawing Sheets

(56) References Cited

U.S. PATENT DOCUMENTS

| | | | |
|---|---|---|---|
| 2010/0045376 A1* | 2/2010 | Soenen | H03F 3/2173 330/251 |
| 2010/0104045 A1* | 4/2010 | Santraine | H03D 3/009 375/324 |
| 2012/0212258 A1 | 8/2012 | Choi et al. | |

FOREIGN PATENT DOCUMENTS

| | | |
|---|---|---|
| CN | 101087146 A | 12/2007 |
| CN | 101662262 A | 3/2010 |
| CN | 101729468 A | 6/2010 |
| CN | 101915873 A | 12/2010 |
| JP | S55 116274 A | 9/1980 |
| JP | S59 195166 A | 11/1984 |
| WO | WO 2011/008635 A1 | 1/2011 |

OTHER PUBLICATIONS

Chinese First Office Action, Chinese Application No. 2014100647651, Feb. 25, 2016. 25 pages.

* cited by examiner

LINE FREQUENCY DETECTOR

CROSS-REFERENCE TO RELATED APPLICATIONS

This application claims the benefit of U.S. Provisional Application No. 61/769,122, filed Feb. 25, 2013, which is incorporated herein by reference in its entirety.

BACKGROUND

The present disclosure relates to line frequency detectors and, in particular, to detecting the line frequency of a power source for a dimmable solid-state lighting device.

Solid-state lighting devices can be connected to a wall dimmer to provide a user with a way of varying the brightness of the lighting device. A wall dimmer typically receives electric power as a sinusoidal waveform (e.g., an AC power source at a line frequency of 50 Hz or 60 Hz) and performs phase cutting on the waveform to generate an input voltage for the lighting device. A controller in the solid-state lighting device measures the phase angle of the phase cut and causes a driver circuit to generate an output current at a corresponding power level for a solid-state light source (e.g., a light-emitting diode) in the lighting device.

One drawback to these types of dimmable solid-state lighting devices is that they are sensitive to changes in the line frequency. A change in line frequency can lead to a significant malfunction in the lighting device if the controller is unable to detect a change in frequency and make corresponding adjustments when generating the output current.

SUMMARY

A line frequency detector receives an input signal representing a power source and determines the line frequency of the power source. The input signal is sent through two band pass filters arranged in parallel. The pass band of the first filter is centered approximately at the high end of an expected range for the frequency of the input signal. The pass band of the second filter is centered approximately at the low end of the expected frequency range. In addition, both pass bands are narrow enough that any higher order harmonics of the input signal are substantially attenuated. Thus, the outputs of the two filters are sinusoidal signals at the frequency of the input signal.

The filtered signals are rectified and sent through low-pass filters to create two characteristic signals that both have substantially constant values. The frequency responses of the two band pass filters are configured so that the ratio between the two characteristic signals represents the line frequency. The line frequency detector calculates the ratio and uses the ratio to determine the line frequency of the power source.

In one embodiment, the line frequency detector is part of a controller for a solid-state lighting device, and the controller includes other components that monitor the output of the line frequency detector and generate a control signal for a driving circuit for the solid-state light source in the lighting device.

The features and advantages described in the specification are not all inclusive and, in particular, many additional features and advantages will be apparent to one of ordinary skill in the art of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present invention can be readily understood by considering the following detailed description in conjunction with the accompanying drawings.

DETAILED DESCRIPTION

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 1:
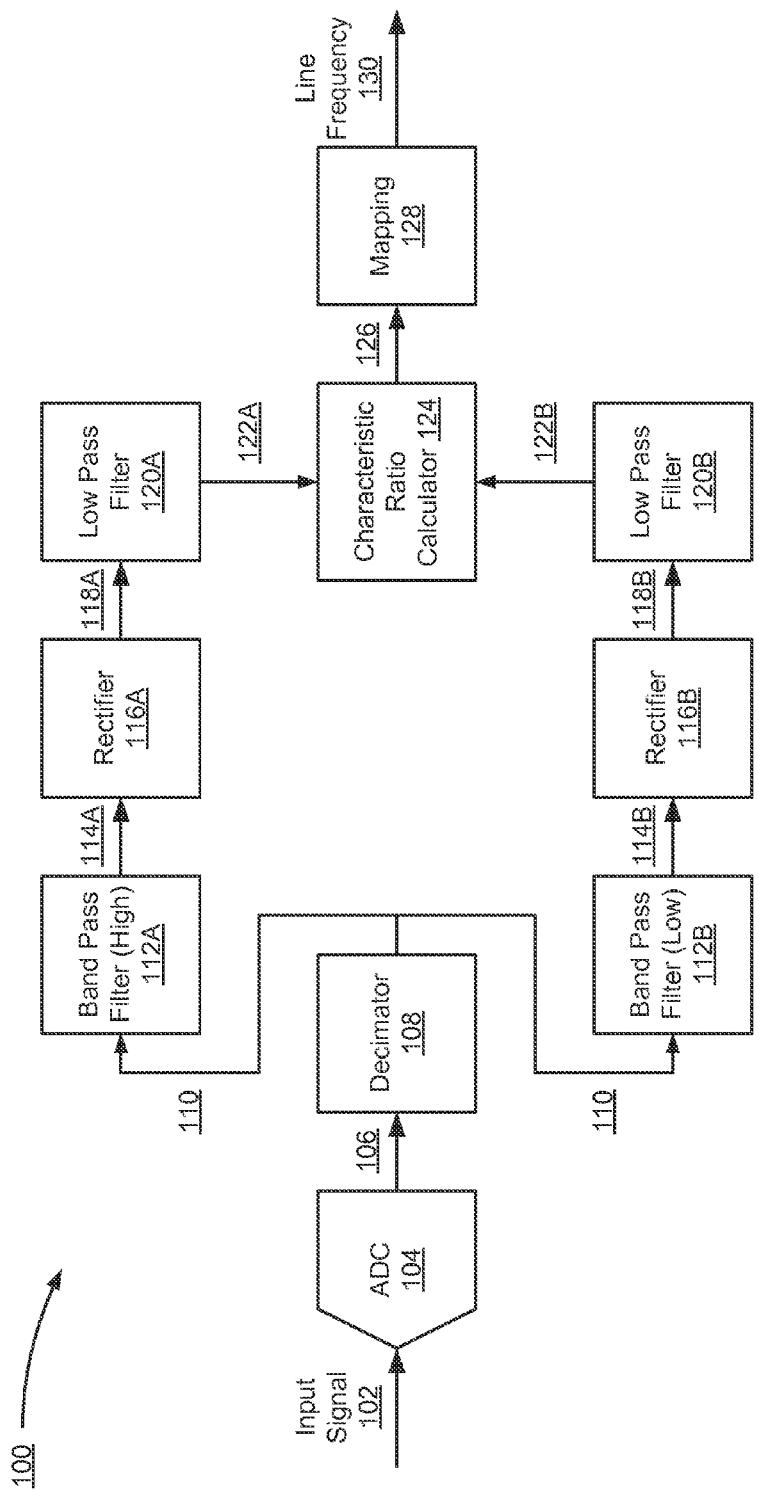
FIG. 1 is a block diagram illustrating a line frequency detector, according to one embodiment.

FIG. 1 is a block diagram illustrating a line frequency detector 100, according to one embodiment. In the illustrated embodiment, the line frequency detector 100 includes an analog-to-digital converter (ADC) 104, a decimator 108, band pass filters 112, rectifiers 116, low pass filters 120, a characteristic ratio calculator 124, and a mapping module 128. At a high level, the line frequency detector 100 is a component of a controller in a solid-state lighting device. The detector 100 receives an analog input signal 102 that represents a power source and outputs the line frequency of the power source. The line frequency can then be used by other components of the controller.

The power source is a source of electrical power that oscillates at a line frequency. For example, if the power source is an alternating current source from a typical electrical power grid, the power source will have a line frequency between 50 Hz and 60 Hz and a line voltage between 100 V and 240 V. In other embodiments, the power source may be an engine-generator or a generator powered by some other means. In these embodiments, the power source may have a different line frequency than a power grid.

The power source can be transformed and distorted in several different ways before it is sent to the line frequency detector 100 as the analog input signal 102. In one embodiment, the power source is rectified (e.g., with a bridge rectifier), and the analog input signal 102 is thus a rectified version of the power source. The power source may additionally be reduced to a lower voltage (e.g., with a transformer). Furthermore, the power source can be coupled to the lighting device via a wall dimmer. In this case, the analog input signal 102 can include distortion due to dimmer multi-firing or due to the phase cut introduced by the dimmer.

In one embodiment, the band pass filters 112 and the low pass filters 120 are digital filters. In this case, the analog-to-digital converter (ADC) 104 and the decimator 108 operate together to transform the analog input signal 102 into a digital input signal 110 that is suitable for the remaining components 112 through 128 of the line frequency detector 100. However, in another embodiment, the band pass filters 112 and low pass filters 120 are analog filters. In this case, the ADC 104 and decimator 108 are omitted from the line frequency detector 100.

The ADC 104 samples the analog input signal 102 to convert the analog input signal 102 into a digital output 106. Various methods of performing analog-to-digital conversion are widely known in the art and a detailed description thereof will be omitted for the sake of brevity.

In some embodiments, the ADC 104 is configured to sample the analog input signal 102 at a higher sampling rate, and the line frequency detector 100 includes a decimator 108 that generates the input signal 110 by downsampling the digital output 106 of the ADC 104. The decimator 108 includes a low-pass filter (e.g., to prevent aliasing) whose output is connected to a downsampler.

An arrangement that includes both the ADC 104 and the decimator 108 is advantageous, but not required, in embodiments where the line frequency detector is part of a lighting controller integrated circuit because the digital output 106 of the ADC 104 can be sent to other digital logic on the lighting controller (e.g., logic for detecting the dimmer turn-on time) at the higher sampling rate. Meanwhile, the input signal 110 (at the lower sampling rate) is used for the digital logic 112 through 128 of the line frequency detector 100, which reduces the coefficients for the filters 112A, 112B and allows the filters 112A, 112B to occupy less physical space.

In other embodiments, the decimator 108 is omitted from the line frequency detector 100 to save space and the digital output of ADC 104 is used as the input signal 110 for the digital logic 112 through 128. This configuration is particularly useful, for example, if the line frequency detector 100 is embodied as a discrete integrated circuit. However, this configuration can also be used in an embodiment where the line frequency detector 100 is part of a lighting controller or in embodiments where the line frequency 100 is used as part of some other system.

After the ADC 104 and (optionally) the decimator 108 generate the digital input signal 110, the remaining components 112 through 128 of the line frequency detector operate together to determine a line frequency 130 of the corresponding power source. For ease of description, these remaining components will be described in conjunction with the plots illustrated in FIGS. 2A-2D.

The band pass filters 112A, 112B perform band pass filtering on the input signal 110 to generate filtered signals 114A, 114B. In the embodiment illustrated in FIG. 1, the band pass filters 112A, 112B are implemented with digital logic. For example, the band pass filters 112A, 112B may be infinite impulse response (IIR) filters.

The center frequencies of the pass bands of the first and second band pass filters 112A, 112B are selected so that they are approximately the upper and lower ends, respectively, of the expected range of the first harmonic frequency of the analog input signal 102. In embodiments where the input signal 102 has been rectified, the fundamental frequency of the input signal 110 is twice the line frequency (that is, equivalent to the first harmonic frequency of the analog input signal 102), and the band pass fitters 112A, 112B are tuned to approximately the upper and lower ends of a frequency range that is twice the expected range of the line frequency. Meanwhile, in embodiments where the input signal 102 has not been rectified, the band pass filters 112A, 112B are tuned to the ends of a frequency range that matches the expected range of the line frequency.

Figure 2A:
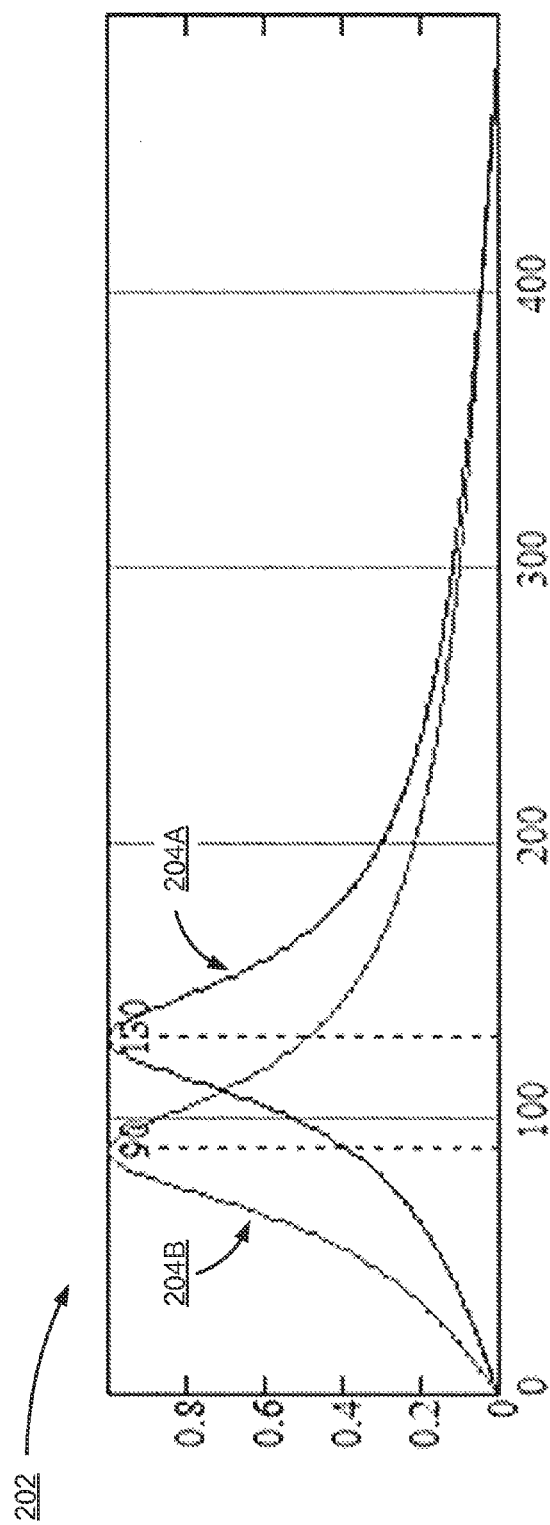
FIG. 2A illustrates example frequency responses for the two band pass filters in the line frequency detector, according to one embodiment.

A plot 202 of example frequency responses 204A, 204B for the two band pass filters 112A, 112B is shown FIG. 2A. In the example of FIG. 2A, the frequency response 204A of the first band pass filter 112A has a pass band centered at approximately 130 Hz, and the frequency response 204B of the second band pass filter 112B has a pass band centered at approximately 90 Hz. Thus, if the input signal 102 has been rectified, the example configuration shown in FIG. 2A can detect line frequencies between 45 Hz and 65 Hz. Furthermore, the pass bands of both filters 112A, 112B are configured to be narrow enough that any higher ordered harmonics are substantially attenuated. Thus, the filtered signals 114A, 114B are substantially sinusoidal signals with the same frequency as the input signal 110.

As can be seen in FIG. 2A, the two frequency responses 204A, 204B cross each other at a crossing point frequency of approximately 110 Hz. If the frequency of the input signal 110 is at this crossing point frequency, then the amplitudes of the two filtered signals 114A, 114B will be the same. Meanwhile, if the frequency of the input signal 110 is higher than the crossing point frequency, then the amplitude of the first filtered signal 114A will be greater than the amplitude of the second filtered signal 114B. Similarly, if the frequency of the input signal 110 is lower than the crossing point frequency, then the amplitude of the first filtered signal 114A will be less than the amplitude of the second filtered signal 114B. In addition, it can be seen that the ratio between the amplitudes of the two filtered signals 114A, 114B will be different for any given frequency between the peaks of the two band pass filters 112A, 112B (e.g., between 90 Hz and 130 Hz). Thus, this ratio can be calculated and mapped to the corresponding line frequency, as described below.

Although the band pass filters 112A, 112B and their respective frequency responses 204A, 204B were described with reference to the plot 202 of FIG. 2A, the frequency responses 204A, 204B shown in this plot 202 are merely exemplary. In other embodiments, the band pass filters 112A, 112B may be configured with different frequency responses as long as the ratio between the amplitudes of the two filtered signals 114A, 114B has the same characteristics. In other words, the crossing point frequency (shown in FIG. 2A as 110 Hz) and the center frequencies (shown in FIG. 2A as 90 Hz and 130 Hz) may have different values as long as the ratio between the amplitudes of the filtered signals 114A, 114B can be mapped back to a unique frequency of the input signal 110.

Each filtered signal 114A, 114B is passed through a rectifier 116A, 116B and low pass filter 120A, 120B to generate a corresponding characteristic signal 122A, 122B. Together, each rectifier 116 and low pass filter 120 causes the corresponding characteristic signal 122A, 122B to settle to a substantially constant value that is proportional to the amplitude of the corresponding filtered signal 112A, 112B.

Figure 2B:
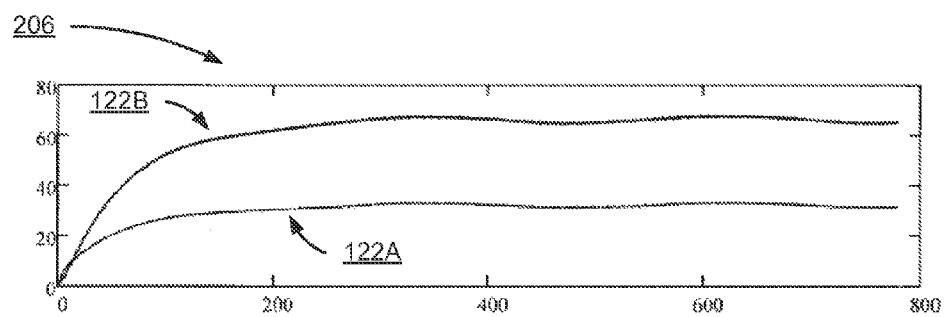
FIGS. 2B-2C illustrate examples of signals within the line frequency detector, according to one embodiment.

An example of two characteristic signals 122A, 122B is illustrated in the plot 206 of FIG. 2B. In the example of FIG.

2B, the input signal 110 had a frequency of approximately 94 Hz (which, since the input signal 110 is rectified, corresponds to a line frequency of 47 Hz in the power source). As can be seen in the plot 202 of FIG. 2A, the value of the first frequency response 204A at 94 Hz is approximately half the value of the second frequency response 204B at 94 Hz. Thus, the first characteristic signal 122A settles to a value that is approximately half the value of second characteristic signal 122B.

Figure 2C:
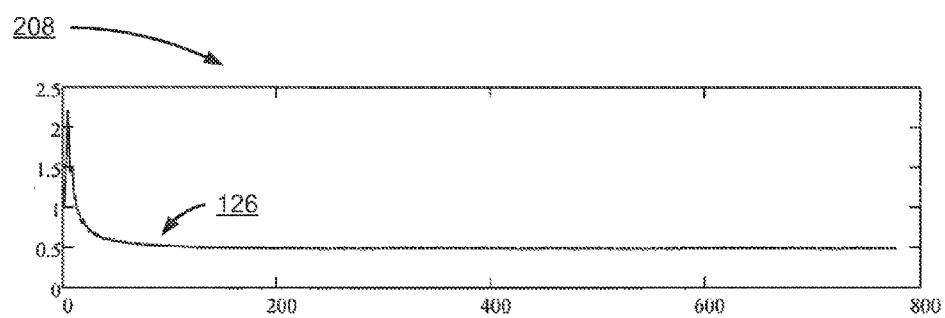

The characteristic ratio calculator 124 calculates a characteristic ratio 126 between the two characteristic signals 122A, 122B. An example plot 208 of the characteristic ratio 126 is illustrated in FIG. 2C. In the embodiment of FIG. 2C, the ratio 126 is calculated by dividing the first characteristic signal 122A by the second characteristic signal 122B. Thus, the ratio 126 shown in the example plot 208 settles to a value of approximately 0.5. In other embodiments, the characteristic ratio 126 can be calculated by dividing the second characteristic signal 122B by the first characteristic signal 122A or with some other formula that includes a ratio between the two characteristic signals 122A, 122B.

As described above, the ratio between the amplitudes of the filtered signals 114A, 114B corresponds to a unique line frequency within the expected range that is defined by the center frequencies of the band pass filters 112A, 112B. Since each characteristic signal 122A, 122B is proportional to the amplitude of the corresponding filtered signal 114A, 114B, the characteristic ratio 126 also corresponds to a unique line frequency within the expected line frequency range. As a result, the characteristic ratio 126 would change to a different value in response to any substantial change in the line frequency. For example, the characteristic ratio 126 in the example plot 208 would change to approximately 1.0 if the line frequency changes to 55 Hz, which corresponds to a frequency of 110 Hz in the rectified input signal 110 the crossing point frequency in FIG. 2A).

Figure 2D:
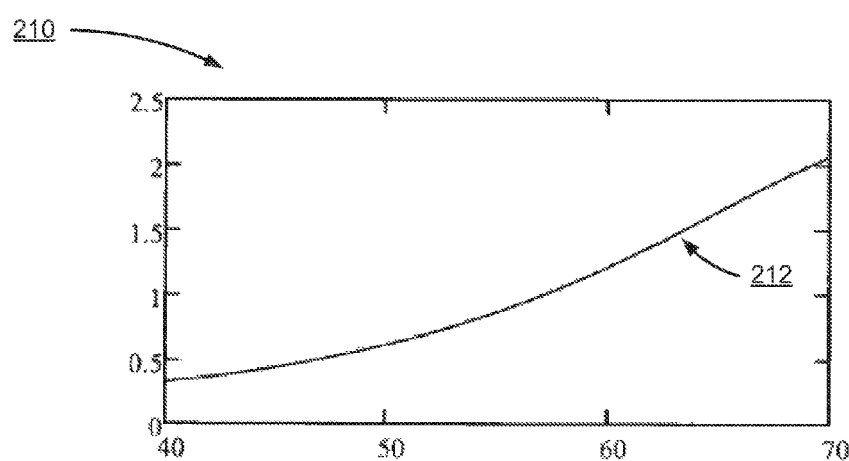
FIG. 2D illustrates an example mapping function from a characteristic ratio to a line frequency, according to one embodiment.

The mapping module 128 determines the line frequency corresponding to the characteristic ratio 126. In one embodiment, the mapping module 128 uses a predetermined mapping function to determine the line frequency. An example plot 210 of a mapping function 212 between characteristic ratio 126 and line frequency is shown in FIG. 2D. In one embodiment, the mapping function 212 is generated by providing calibration signals (e.g., sinusoidal signals with a known frequency) as input to the line frequency detector 100 and recording the characteristic ratio that is generated for the calibration signal at each frequency. Regression analysis can then be performed to find a mapping function that represents the relationship between characteristic ratio and line frequency. For example, the mapping function 212 can be a third order polynomial function whose coefficients are calculated by performing a third-order polynomial regression. In another embodiment, the mapping function can be calculated analytically by calculating the ratio between the frequency responses of the two band pass filters at each of a plurality of frequencies within the expected range of the frequency of the input signal 110.

If the characteristic ratio calculator 124 is implemented as a digital logic block, the characteristic ratio 126 is a series of discrete digital values. In some embodiments, the mapping module 128 does not map each discrete value of the characteristic ratio 126 to a line frequency. Instead, the mapping module 128 in these embodiments is configured to periodically sample the characteristic ratio 126 and map each sampled value of the characteristic ratio 126 to a line frequency 130. For example, the mapping may be configured to map every tenth value or every $100^{th}$ value of the ratio 126. Alternatively, the mapping may be configured to map the ratio 126 to a line frequency 130 at predetermined time intervals (e.g., every 0.5 seconds, or every 1.0 seconds).

After the mapping module 128 determines a line frequency 130, the line frequency 130 can be used as an input to other portions of the lighting controller. For example, a dimming factor circuit on the controller can use the line frequency 130 in conjunction with other inputs to determine a desired degree of dimming and generate a corresponding control signal for a driver circuit that powers a light emitting diode.

In an alternative embodiment, the ADC 104 and decimator 108 are omitted, and the other components 112 through 128 of the line frequency detector 100 are implemented as analog components. In another alternative embodiment, a portion of the components 112 through 128 are implemented as analog components, and the remaining components are digital logic. For example, the band pass filters 112A, 112B, rectifiers 116A, 116B, and low pass filters 120A, 120B are implemented as analog components, the characteristic ratios 122A, 122B are digitized with ADCs, and the remaining components 124, 128 are implemented as digital logic.

Figure 3:
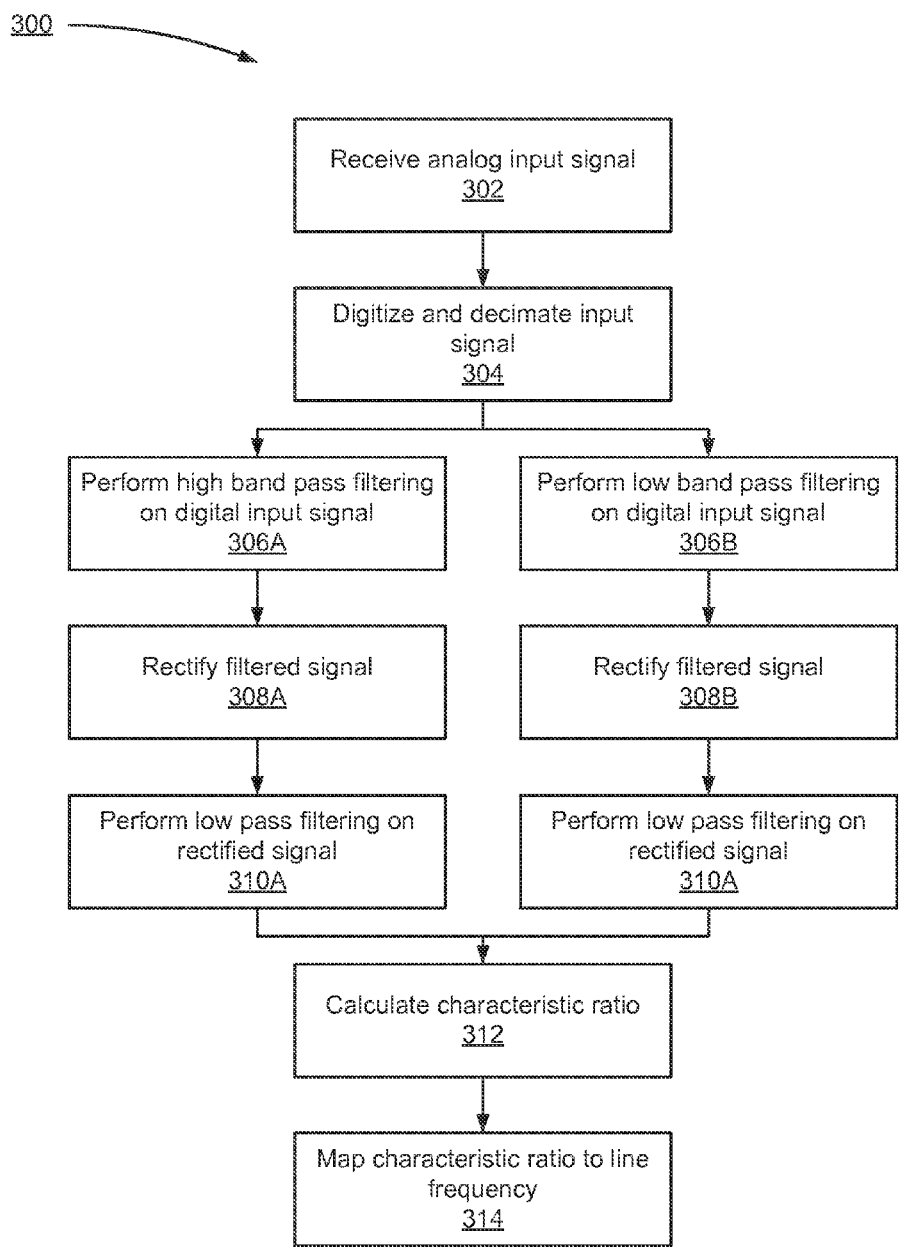
FIG. 3 is a flow chart illustrating a process for detecting a line frequency, according to one embodiment.

FIG. 3 is a flow chart illustrating a process 300 for detecting a line frequency using the line frequency detector 100, according to one embodiment. The line frequency detector 100 receives 302 an analog input signal 102, and the ADC 104 and decimator 108 digitize and decimate 304 the analog input signal 102 to create a digital input signal 110.

The digital input signal 110 is sent to two band pass filters 112A, 112B. The first band pass filter 112A performs 306A high band pass filtering 306A and the second band pass filter 112B performs 306B low band pass filtering to create filtered input signals 114A, 114B. As described above, the filtered signals 114A, 114B will both be substantially sinusoidal signals that have the same frequency as the digital input signal 110, and the ratio between the amplitudes of the two filtered signals 114A, 114B will vary based on the frequency of the input signal.

The rectifiers 116A, 116B rectify 308A, 308B the filtered signals 114A 114B to create rectified signals 118A, 118B, and the low pass filters 120A, 120B perform 310A, 310B low pass filtering on the rectified signals 118A, 118B to create two characteristic signals 112A, 112B. The combination of the rectification and low pass filtering causes the two characteristic signals 118A, 118B to settle to substantially constant values that are proportional to the amplitudes of the corresponding filtered signals 114A, 114B.

The characteristic ratio calculator 124 receives the characteristic signals 112A, 112B and calculates 312 a characteristic ratio 126. For example, the characteristic ratio calculator 124 may divide the first characteristic signal 112A by the second characteristic signal 112B. Since the characteristic ratio 126 corresponds to a unique line frequency within the frequency range of the detector 100, the mapping function 128 can then map 314 the characteristic ratio 126 back to the line frequency 130. The detected line frequency 130 can then be used by other digital logic on the solid-state lighting controller.

The line frequency detector 100 and the corresponding method 300 described herein provide several advantages. First, since the band pass filters 112A, 112B pass the fundamental frequency but attenuate the higher order harmonics of the input signal 110, most forms of distortion in the input signal 110 do not have any significant effect on the characteristic ratio 126 or the detected line frequency 130. Thus, the line frequency detector 100 can reliably detect the line frequency of a power source even if the input signal 102 is subject to multi-firing or if the wall dimming unit introduces a phase cut into the signal 102. In addition, the line frequency detector 100 is not affected by changes in the amplitude of the input signal 104 because the characteristic signals 122A, 122B are divided by each other to calculate the characteristic ratio 126. As a result, the line frequency detector 100 can be used with power sources at various line voltages without any significant modifications.

The line frequency detector 100 in the embodiments described above is implemented as part of a controller in a dimmable solid-state lighting device. However, in other embodiments, the line frequency detector 100 can be part of a different system or device in which it would be advantageous to monitor the frequency of a signal. The line frequency detector 100 can also be implemented as a stand-alone integrated circuit that receives the analog input signal 102 at one or more external pins and outputs the line frequency 130 at one or more external pins. Alternative, some or all of the components 104 through 128 of the line frequency detector 100 can be implemented as discrete electronic components that are connected together in the manner shown in FIG. 1.

Upon reading this disclosure, those of skill in the art will appreciate still additional alternative designs for a line frequency detector. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein.

What is claimed is:

1. A line frequency detector for receiving an input signal representing a power source and detecting a line frequency of the power source based on the input signal, the line frequency detector comprising:
   a first band pass filter adapted to filter the input signal to generate a first characteristic signal, the first band pass filter having a pass band centered approximately at an upper end of an expected frequency range of the input signal;
   a second band pass filter adapted to filter the input signal to generate a second characteristic signal, the second band pass filter having a pass band centered approximately at a lower end of an expected frequency range of the input signal;
   a characteristic ratio calculator adapted to determine a characteristic ratio representing a division of the first characteristic signal by the second characteristic signal; and
   a mapping module adapted to map the characteristic ratio to the line frequency of the power source.

2. The line frequency detector of claim 1, further comprising:
   a rectifier adapted to rectify the first characteristic signal and the second characteristic signal; and
   a low-pass filter adapted to filter the rectified signals to generate a first filtered signal and a second filtered signal;
   wherein the characteristic ratio calculator is adapted to determine the characteristic ratio between the first filtered signal and the second filtered signal.

3. The line frequency detector of claim 1, wherein the mapping module is adapted to map the characteristic ratio to the line frequency of the power source by:
   applying the characteristic ratio to a mapping function, the mapping function representing a relationship between the characteristic ratio and the line frequency of the power source.

4. The line frequency detector of claim 1, wherein the mapping module is adapted to map the characteristic ratio to the line frequency of the power source by:
   determining a ratio between a frequency response of the first band pass filter and a frequency response of the second band pass filter at each of a plurality of frequencies; and
   mapping the characteristic ratio to the line frequency based on the determined ratio.

5. The line frequency detector of claim 1, wherein the input signal is a digital signal and the first and second band pass filters are digital filters, the line frequency detector further comprising:
   an analog-to-digital converter adapted to receive an analog signal representing the power source and to convert the analog signal to the digital input signal.

6. The line frequency detector of claim 5, further comprising:
   a decimator adapted to downsample a digital output of the analog-to-digital converter to generate the digital input signal.

7. The line frequency detector of claim 1, wherein the pass band of the first band pass filter and the pass band of the second band pass filter attenuate harmonics of the input signal.

8. The line frequency detector of claim 1, wherein the pass band of the first band pass filter is a first percentage above the upper end of the expected frequency range of the input signal and the pass band of the second band pass filter is a second percentage below the lower end of the expected frequency range of the input signal.

9. A method for detecting a line frequency of a power source, the method comprising:
   receiving an input signal representing the power source;
   generating a first characteristic signal by filtering the input signal using a first band pass filter, the first band pass filter having a pass band centered approximately at an upper end of an expected frequency range of the input signal;
   generating a second characteristic signal by filtering the input signal using a second band pass filter, the second band pass filter having a pass band centered approximately at a lower end of the expected frequency range of the input signal;
   determining a characteristic ratio representing a division of the first characteristic signal by the second characteristic signal; and
   mapping the characteristic ratio to the line frequency of the power source.

10. The method of claim 9, further comprising:
    rectifying the first characteristic signal and the second characteristic signal; and
    low-pass filtering the rectified signals to generate a first filtered signal and a second filtered signal;
    wherein determining the characteristic ratio between the first characteristic signal and the second characteristic signal comprises determining a ratio between the first filtered signal and the second filtered signal.

11. The method of claim 9, wherein mapping the characteristic ratio to the line frequency comprises:
    applying the characteristic ratio to a mapping function, the mapping function representing a relationship between the characteristic ratio and the line frequency.

12. The method of claim 9, wherein mapping the characteristic ratio to the line frequency comprises:
   determining a ratio between a frequency response of the first band pass filter and a frequency response of the second band pass filter at each of a plurality of frequencies; and
   mapping the characteristic ratio to the line frequency based on the determined ratio.

13. The method of claim 9, wherein the input signal is a digital signal, the method further comprising:
   receiving an analog signal representing the power source; and
   generating the input signal from the analog signal using an analog-to-digital converter.

14. The method of claim 13, wherein generating the input signal comprises:
   downsampling a digital output of the analog-to-digital converter.

15. The method of claim 9, wherein the pass band of the first band pass filter is a first percentage above the upper end of the expected frequency range of the input signal and the pass band of the second band pass filter is a second percentage below the lower end of the expected frequency range of the input signal.

* * * * *